United States Patent
Son et al.

(10) Patent No.: US 7,422,965 B2
(45) Date of Patent: Sep. 9, 2008

(54) METHODS OF FABRICATING P-TYPE TRANSISTORS INCLUDING GERMANIUM CHANNEL REGIONS

(75) Inventors: Yong-Hoon Son, Yongin-si (KR); Yu-Gyun Shin, Seongnam-si (KR); Jong-Wook Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 93 days.

(21) Appl. No.: 11/447,436

(22) Filed: Jun. 6, 2006

(65) Prior Publication Data

US 2006/0292880 A1    Dec. 28, 2006

(30) Foreign Application Priority Data

Jun. 24, 2005    (KR)    .................. 10-2005-0054802

(51) Int. Cl.
*H01L 21/20* (2006.01)
*H01L 21/36* (2006.01)

(52) U.S. Cl. .................. 438/478; 438/486; 438/487; 438/621

(58) Field of Classification Search .................. 438/933, 438/142, 275, 276, 278, 289, 309, 478, 486, 438/487, 621, 660, 662
See application file for complete search history.

(56) References Cited

U.S. PATENT DOCUMENTS

| 6,121,112 | A | 9/2000 | Sakaguchi et al. |
| 6,228,750 | B1 * | 5/2001 | Shibib ........................ 438/558 |
| 6,538,330 | B1 | 3/2003 | Forbes |
| 6,885,031 | B2 | 4/2005 | Kamins |
| 7,084,078 | B2 * | 8/2006 | Ahn et al. .................... 438/785 |
| 7,238,557 | B2 * | 7/2007 | Hayakawa .................. 438/161 |
| 2003/0148565 | A1 * | 8/2003 | Yamanaka .................. 438/200 |

FOREIGN PATENT DOCUMENTS

| JP | 08-298329 | 11/1996 |
| JP | 10-144606 | 5/1998 |
| JP | 11-102866 | 4/1999 |
| JP | 2002-184993 | 6/2002 |

OTHER PUBLICATIONS

Notice to Submit Response corresponding to Korean Patent Application No. 10-2005-0054802 mailed Oct. 26, 2006.

\* cited by examiner

*Primary Examiner*—Walter L. Lindsay, Jr.
*Assistant Examiner*—Kenisha V Ford
(74) *Attorney, Agent, or Firm*—Myers Bigel Sibley & Sajovec, PA

(57) ABSTRACT

A method of fabricating a transistor device includes forming a non-crystalline germanium layer on a seed layer. The non-crystalline germanium layer is selectively locally heated to about a melting point thereof to form a single-crystalline germanium layer on the seed layer. The non-crystalline germanium layer may be selectively locally heated, for example, by applying a laser to a portion of the non-crystalline germanium layer. Related devices are also discussed.

18 Claims, 10 Drawing Sheets

METHODS OF FABRICATING P-TYPE TRANSISTORS INCLUDING GERMANIUM CHANNEL REGIONS

CROSS REFERENCE TO RELATED APPLICATION

This application claims priority from Korean Patent Application No. 10-2005-54802 filed on Jun. 24, 2005, the disclosure of which is hereby incorporated by reference herein in its entirety.

FIELD OF THE INVENTION

The present invention relates to semiconductor devices, and more particularly, to field-effect transistors (FETs) and methods of fabricating the same.

BACKGROUND OF THE INVENTION

As semiconductor devices are scaled-down, the size of conductive structures and intervals between the structures may also be scaled down. However, a reduction of the size and/or intervals between the structures may increase electrical resistance in the structures, and as such, may deteriorate the electrical reliability of a semiconductor device.

Accordingly, stacked semiconductor devices have been implemented in which the conductive structures may be vertically stacked on a substrate, as disclosed in U.S. Pat. No. 6,538,330. The stacked structure may be widely applied to various devices, such as static random access memory (SRAM) devices and/or system on chip (SOC) devices.

In particular, because an SRAM device generally includes six transistors in a unit cell, a multilayer structure in which the six transistors are vertically stacked may be employed as a unit structure of the transistor. For example, when the six transistors of the SRAM device are stacked in a double layer structure (i.e., a double stacked SRAM device), NMOS (N-channel Metal Oxide Semiconductor) transistors corresponding to a pair of pull down devices and a pair of access devices may be formed at a lower portion of the SRAM device. PMOS (P-channel Metal Oxide Semiconductor) transistors corresponding to a pair of pull up devices may be formed at an upper portion of the SRAM device, and may be electrically connected with the NMOS transistors. As another example, when the six transistors of the SRAM device are stacked in a triple layer structure (known as a triple-stacked SRAM device), first NMOS transistors corresponding to a pair of pull down devices may be formed at a lower portion of the SRAM device. PMOS transistors corresponding to a pair of pull up devices may be formed at an upper portion of the first NMOS transistors, and may be electrically connected with the first NMOS transistors. Second NMOS transistors corresponding to a pair of access devices may be formed at an upper portion of the PMOS transistors.

In such a stacked semiconductor device, conductive structures such as transistors may be vertically stacked in a multilayer structure. As such, insulation interlayer patterns in the multilayer structure may be formed on single crystalline channel layers.

In general, operational characteristics of NMOS transistors may be superior when the channel layer includes single crystalline silicon, while operational characteristics of PMOS transistors may be superior when the channel layer includes single crystalline germanium. The single crystalline silicon channel layer may be formed by a heat treatment. A non-crystalline silicon thin layer, such as an amorphous silicon layer, may be formed on a substrate, and a heat treatment (such as laser irradiation) may be performed on the non-crystalline silicon thin layer. As a result, non-crystalline silicon may be transformed into crystalline silicon, thereby forming the single crystalline silicon layer. In contrast, the single crystalline germanium channel layer may be formed by a zone melting re-crystallization (ZMR) process. Examples of ZMR processes are disclosed in U.S. Pat. Nos. 6,121,112 and 6,885,031. In particular, a ZMR process for forming the single crystalline germanium channel layer may employ a heat treatment performed at a temperature higher than about 1,400° C. for a relatively long period of time.

Severe thermal stress may not result from the heat treatment used to form the single crystalline silicon channel layer, because the heat treatment may be performed at a relatively low temperature. As such, operational characteristics of semiconductor devices may not be deteriorated due to this heat treatment. In contrast, thermal stress may be applied to a unit structure underlying the channel layer during the high-temperature heat treatment used to form the single crystalline germanium channel layer, which may thereby deteriorate operational characteristics of the semiconductor device.

Accordingly, single crystalline silicon is typically used as the channel layer in conventional stacked semiconductor devices, regardless of transistor type (NMOS or PMOS). As such, operational characteristics of PMOS transistors may not be optimized, which may negatively affect the performance of semiconductor devices.

SUMMARY OF THE INVENTION

According to some embodiments of the present invention, a PMOS transistor may include a channel layer including single crystalline germanium, a gate pattern on the channel layer, and source/drain regions at surface portions of the channel layer close to the gate pattern. The single crystalline germanium channel layer may be formed by changing a crystal structure of a non-crystalline germanium layer into a single crystal structure using a laser irradiated thereto. The gate pattern may include a gate insulation layer on the channel layer and a gate conductive layer on the gate insulation layer. The source/drain regions may be doped with impurities including elements from Group III of the periodic table.

According to other embodiments of the present invention, a method of forming a PMOS transistor is provided. A non-crystalline germanium layer may be formed on a seed layer comprising a single crystal. A phase of the non-crystalline germanium layer may be transformed by irradiating a laser to the non-crystalline germanium layer. A crystal structure of the non-crystalline germanium layer may be changed into a single crystal structure using the single crystal of the seed layer during the transformation of the non-crystalline germanium layer, which may thereby form a channel layer including single crystalline germanium. A gate pattern may be formed on the channel layer, and the gate pattern may include a gate insulation layer and a gate conductive layer. Source/drain regions may be formed at surface portions of the channel layer close to the gate pattern. The source/drain regions may be doped with impurities including elements from Group III of the periodic table.

In some embodiments of the present invention, the laser may be irradiated onto the non-crystalline germanium layer for a time ranging from about a few nano-seconds to about a few hundred nano-seconds at such intensity that heat ranging from about 937° C. to about 1,000° C. may be transferred to the non-crystalline germanium layer (because a melting point of the non-crystalline germanium layer may be about 937.4° C.).

According to still other embodiments of the present invention, a stacked semiconductor device may include a channel layer including an NMOS transistor having a first channel layer, a PMOS transistor having a second channel layer of single crystalline germanium, an insulation interlayer interposed between the NMOS and PMOS transistors, and a single crystalline plug. The NMOS transistor may include a first gate pattern on the first channel layer and first source/drain regions at surface portions of the first channel layer close to the first gate pattern. The first gate pattern may include a first gate insulation layer and a first gate conductive layer, and the first source/drain regions may be doped with impurities including elements from Group V of the periodic table. The second channel layer of single crystalline germanium may be formed by changing a crystal structure of a non-crystalline germanium layer using a laser irradiated thereto. The PMOS transistor may include a second gate pattern on the second channel layer and second source/drain regions at surface portions of the second channel layer close to the second gate pattern. The second gate pattern may include a second gate insulation layer and a second gate conductive layer, and the second source/drain regions may be doped with impurities including elements from Group III of the periodic table. The insulation interlayer may include an opening through which the first and second channel layers are exposed. The single crystalline plug may fill the opening, and the single crystalline plug may make contact with the first and second channel layers.

According to still further embodiments of the present invention, a method of manufacturing a stacked semiconductor device is provided. A first channel layer comprising single crystalline silicon may be prepared, and a first gate pattern may be formed on the first channel layer. The first gate pattern may include a first gate insulation layer and a first conductive layer. First source/drain regions may be doped with impurities including elements from Group V of the periodic table, and may be formed at surface portions of the first channel layer close to the first gate pattern, which may thereby form an NMOS transistor including the first gate pattern and the first source/drain regions on the first channel layer. An insulation interlayer may be formed on the first channel layer including the NMOS transistor, and the insulation interlayer may include an opening through which the first channel layer may be partially exposed. A single crystalline plug may be formed in the opening, and a non-crystalline germanium layer may be formed on the insulation interlayer and the single crystalline plug. A phase of the non-crystalline germanium layer may be transformed by irradiating a laser to the non-crystalline germanium layer. A structure of the non-crystalline germanium layer may be changed into a single crystal structure using the single crystal of the seed layer during the transformation of the non-crystalline germanium layer, which may thereby form a second channel layer including single crystalline germanium. A second gate pattern may be formed on the second channel layer. The second gate pattern may include the second gate insulation layer and the second gate conductive layer. Second source/drain regions may be formed at surface portions of the second channel layer close to the second gate pattern. The second source/drain regions may be doped with impurities including elements from Group III of the periodic table, which may thereby form a PMOS transistor including the second gate pattern and the second source/drain regions on the second channel layer.

According to some embodiments of the present invention, a method of fabricating a transistor device may include forming a non-crystalline germanium layer on a seed layer, and selectively locally heating the non-crystalline germanium layer to about a melting point thereof. As such, a single-crystalline germanium layer may be formed on the seed layer.

In some embodiments, a laser may be applied to a portion of the non-crystalline germanium layer for less than about 100 ns to selectively locally heat the non-crystalline germanium layer. For example, the laser may be scanned across the non-crystalline germanium layer from a first end to a second end thereof.

In other embodiments, the non-crystalline germanium layer may be selectively locally heated to a temperature of about 937 degrees Celsius (° C.) to about 1000 degrees Celsius (° C.) using laser irradiation. In addition, the seed layer may be heated to a temperature of about 200 degrees Celsius (° C.) to about 600 degrees Celsius (° C.).

In some embodiments, the seed layer may have an absorption coefficient different from that of the non-crystalline germanium layer. The seed layer may include silicon and/or germanium.

In other embodiments, a gate structure may be formed on the single crystalline germanium layer. First and second p-type source/drain regions may be formed in the single crystalline germanium layer on opposite sides of the gate structure to define a p-type transistor device. More particularly, the first and second p-type source/drain regions may be formed by doping the single-crystalline germanium layer with Group III impurity atoms using the gate structure as a mask.

In some embodiments, a second gate structure may be formed on a substrate prior to forming the non-crystalline germanium layer. First and second n-type source/drain regions may be formed in the substrate on opposite sides of the second gate structure to define an n-type transistor device. The seed layer may be formed on the substrate adjacent the second gate structure.

According to other embodiments of the present invention, a method of fabricating a semiconductor device may include forming an n-type transistor on a silicon substrate, and forming a non-crystalline germanium layer on the substrate. The non-crystalline germanium layer may be selectively locally irradiated using a laser to heat the non-crystalline germanium layer to about a melting point thereof, to form a single-crystalline germanium layer. A p-type transistor may be formed on the single-crystalline germanium layer.

In some embodiments, the laser may be applied to a portion of the non-crystalline germanium layer for less than about 100 ns to selectively locally irradiate the non-crystalline germanium layer. For example, the laser may be scanned across the non-crystalline germanium layer from a first end to a second end thereof.

In other embodiments, the non-crystalline germanium layer may be heated to a temperature of about 937 degrees Celsius (° C.) to about 1000 degrees Celsius (° C.) using the laser to selectively locally irradiate the non-crystalline germanium layer.

In some embodiments, an insulation layer may be formed on the n-type transistor and the substrate prior to forming the non-crystalline germanium layer. The insulation layer may have an opening extending therethrough and exposing a surface of the substrate, and a contact plug may be formed in the opening. For example, the contact plug may be formed in the opening by epitaxially growing a silicon seed layer in the opening on the exposed surface of the substrate. The non-crystalline germanium layer may be formed on the insulation layer and on the contact plug.

In other embodiments, to form the p-type transistor, a gate structure may be formed on the single-crystalline germanium layer. The single-crystalline germanium layer may be doped with Group III impurity atoms using the gate structure as a mask to define first and second p-type source/drain regions in the single crystalline germanium layer on opposite sides of the gate structure.

In some embodiments, to form the n-type transistor, a second gate structure may be formed on the silicon substrate. The substrate may be doped with Group V impurity atoms using the second gate structure as a mask to define first and second n-type source/drain regions in the substrate on opposite sides of the second gate structure.

According to still further embodiments of the present invention, a semiconductor device may include an n-type transistor on a silicon substrate, and an insulation layer on the n-type transistor and the substrate having an opening extending therethrough and exposing a surface of the substrate. A contact plug may be on the substrate in the opening, a single-crystalline germanium layer may be on the insulation layer, and a p-type transistor may be on the single-crystalline germanium layer.

In some embodiments, the p-type transistor may include a gate structure on the single crystalline germanium layer, and first and second p-type source/drain regions. The first and second p-type source/drain regions may include Group III impurity atoms in the single crystalline germanium layer on opposite sides of the gate structure.

In other embodiments, the n-type transistor may include a second gate structure on the silicon substrate, and first and second n-type source/drain regions. The first and second n-type source/drain regions may include Group V impurity atoms in the substrate on opposite sides of the second gate structure.

In some embodiments, the contact plug may have an absorption coefficient different from that of the single-crystalline germanium layer. The contact plug may include silicon and/or germanium. In other embodiments, the contact plug may be an epitaxial layer.

Thus, according to some embodiments of the present invention, a laser may be irradiated onto the non-crystalline germanium layer for a relatively short time of about a few nano-seconds to about a few hundred nano-seconds, and a crystal structure of the non-crystalline germanium layer may be changed into a single crystal structure during a phase transformation of the non-crystalline germanium layer, thereby forming a single crystalline germanium layer as the channel layer of the PMOS transistor. Little or no thermal stress may be applied to an underlying structure due to the relatively short irradiation time of the laser, although the non-crystalline germanium layer may be heated to a temperature of about 1,000° C. by the laser. As such, electrical reliability of the PMOS transistor and the stacked semiconductor device including the PMOS transistor may be improved.

DETAILED DESCRIPTION OF EMBODIMENTS OF THE INVENTION

Figure 1:
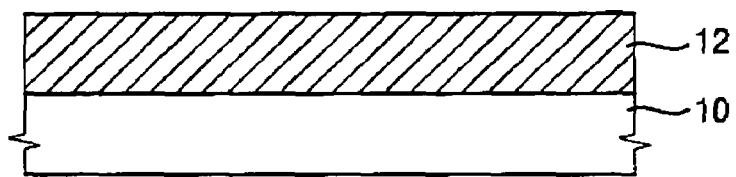
FIG. 1 is a cross sectional view illustrating a single crystalline germanium thin layer for a PMOS transistor according to some embodiments of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a cross sectional view illustrating a single crystalline germanium thin layer for a PMOS transistor according to some embodiments of the present invention. Referring now to FIG. 1, a seed layer 10 is prepared and a thin layer 12 including single crystalline germanium is formed on the seed layer 10. The seed layer 10 may be formed of silicon, germanium, and/or silicon-germanium. As such, the seed layer 10 may be a silicon substrate, a germanium substrate, or a silicon-germanium substrate. The seed layer 10 may be an epitaxial layer formed by a selective epitaxial growth (SEG) process. In some embodiments, a non-crystalline germanium thin layer is formed on the seed layer 10, and the non-crystalline germanium thin layer is selectively locally irradiated using a laser. Accordingly, non-crystalline germanium may be transformed into single crystalline germanium due to heat from the laser, thereby forming the single crystalline germanium layer 12 on the seed layer 10.

A process for forming the single crystalline germanium thin layer will now be described in greater detail with reference to FIG. 1. A non-crystalline germanium thin layer (not shown) is formed on the seed layer 10, and the laser is selectively locally irradiated onto the non-crystalline germanium thin layer. When heat of a temperature less than about 937° C. is transferred to the non-crystalline germanium thin layer by the laser, it may be difficult to change the crystal structure of the non-crystalline germanium, because the melting point of the non-crystalline germanium thin layer is about 937.4° C. In addition, when the non-crystalline germanium thin layer is irradiated for longer than a few hundred nano-seconds, the seed layer 10 may be subjected to thermal stress. Accordingly, the non-crystalline germanium thin layer is selectively locally irradiated using the laser for a time period ranging from about a few nano-seconds to about a few hundred nano-seconds at a sufficient intensity so that heat is transferred to the non-crystalline germanium thin layer at a temperature of no less than about 937° C., and so that the seed layer 10 is subjected to very little thermal stress. For example, the non-crystalline germanium thin layer may be irradiated for about 100 nano-seconds at an intensity sufficient to heat the non-crystalline germanium thin layer to a temperature of about 937° C. to about 1,000° C.

A laser unit configured to provide the laser may include a gaseous laser source such as an excimer laser, and the laser unit may be driven in a scan mode to selectively irradiate a relatively large area of the non-crystalline germanium thin layer for a time period of about a few nano-seconds to about a few hundred nano-seconds. In other words, the laser unit may scan the non-crystalline germanium layer to selectively locally heat each portion thereof for a relatively short period of time. A lower portion of the seed layer 10 may also be heated by irradiating the non-crystalline germanium thin layer using the laser, and a temperature gradient in the non-crystalline germanium thin layer may be sufficiently decreased to thereby enlarge a size of grains in the single crystalline germanium layer 12. When the seed layer is heated at a temperature below about 200° C., the size enlargement of the grains may be negligible, while at a temperature over about 600° C., the seed layer 10 may be stressed by the high temperature. Accordingly, the seed layer 10 is typically heated at a temperature between about 200° C. to about 600° C.

The laser may cause a phase transformation of the non-crystalline germanium thin layer, in particular, from a solid state to a liquid state. However, the non-crystalline germanium thin layer may not "flow" from the seed layer 10, because the phase transformation of the non-crystalline germanium thin layer is locally generated for a relatively short time (i.e., a few nano-seconds). Although the phase transformation of the non-crystalline germanium thin layer may extend to a boundary surface/interface between the seed layer 10 and the non-crystalline germanium thin layer, the heat caused by the laser may have relatively little effect on the seed layer 10 because an absorption coefficient of the seed layer 10 is different from that of the non-crystalline germanium thin layer.

Further, a single crystal of the seed layer 10 may function as a seed during the phase transformation of the non-crystalline germanium thin layer, so that a non-crystalline structure of the non-crystalline germanium thin layer is changed into a crystalline structure in both a vertical direction with respect to the non-crystalline germanium thin layer and in a parallel direction along the non-crystalline germanium thin layer.

Accordingly, the non-crystalline germanium thin layer is formed on the seed layer 10, and the heat caused by the laser locally changes the crystal structure of the non-crystalline germanium thin layer into a single-crystal structure, thereby forming a single crystalline germanium thin layer 12 on the seed layer 10. As such, the single crystalline germanium thin layer 12 may be used as a channel layer in a stacked semiconductor device.

More particularly, portions of the non-crystalline germanium thin layer are locally irradiated using a laser for a relatively short time (ranging from about a few nano-seconds to about a few hundred nano-seconds), so that little or no thermal stress is applied to the seed layer 10 during irradiation. Accordingly, electrical characteristics of a semiconductor device may be improved.

Figure 2:
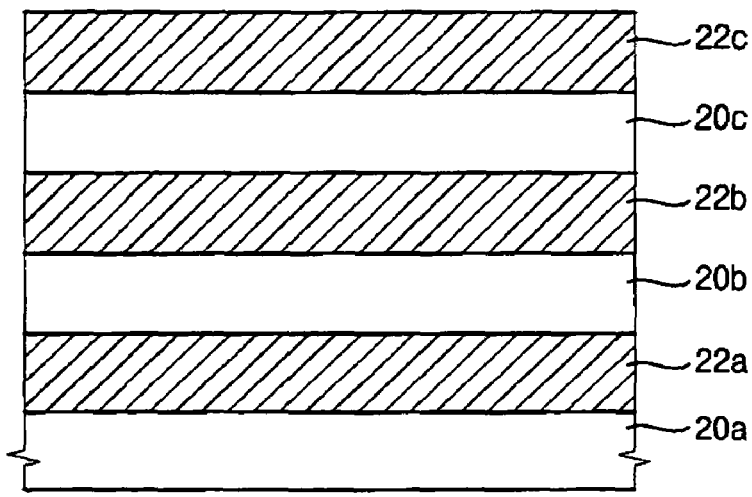
FIG. 2 is a cross sectional view illustrating a multilayer structure including a thin layer and a seed layer according to some embodiments of the present invention.

The single crystalline germanium thin layer 12 shown in FIG. 1 may also be applied to a multilayer structure, as shown in FIG. 2. FIG. 2 is a cross sectional view illustrating a multilayer structure including a plurality of thin layers and seed layers. In FIG. 2, reference numerals 20a, 20b and 20c denote first, second and third seed layers, respectively, and reference numerals 22a, 22b and 22c denote first, second and third single crystalline germanium thin layers, respectively.

The first, second and third seed layers 20a, 20b and 20c may be similar to the seed layer 10 shown in FIG. 1, with the exception that the first seed layer 20a includes a single crystalline substrate, and the second and third seed layers 20b and 20c include a single crystalline epitaxial layer formed through a selective epitaxial growth (SEG) process.

The first, second and third single crystalline germanium thin layers 22a, 22b and 22c may have a similar structure as the single crystalline germanium thin layer 10 shown in FIG. 1, and a crystal structure of a non-crystalline germanium thin layer may be changed into a single-crystal structure by laser irradiation to thereby form the first, second and third single crystalline germanium thin layers 22a, 22b and 22c. Therefore, very little thermal stress may be applied to each of the seed layers 20a, 20b and 20c in forming each of the single crystalline germanium thin layers 22a, 22b and 22c, thereby improving electrical characteristics of semiconductor devices including such multilayer structures.

Although FIG. 2 illustrates three single crystalline germanium layers are stacked in the multilayer structure, additional thin layers may be stacked on the third single crystalline germanium layer 22c, as known to one of the ordinary skill in the art. For example, a fourth seed layer (not shown) may further be formed on the third single crystalline germanium layer 22c by a similar selective epitaxial process as used to form the first seed layer 20a, and a fourth single crystalline germanium layer (not shown) may further be formed on the fourth seed layer in a similar process as used to form the first single crystalline germanium layer 22a. Moreover, by repeatedly performing these processes, an $n^{th}$ (where n is a positive integer no less than five) seed layer and an $n^{th}$ (n is a positive integer no less than five) single crystalline germanium layer may be formed on the fourth single crystalline germanium layer.

Figure 3:
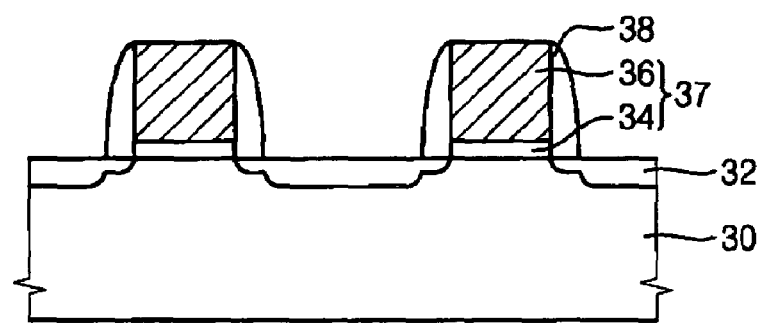
FIG. 3 is a cross sectional view illustrating a PMOS transistor including a single crystalline germanium channel layer according to some embodiments of the present invention.

Hereinafter, a PMOS transistor including a single crystalline germanium layer as a channel layer will be described with reference to FIG. 3. FIG. 3 is a cross sectional view illustrating a PMOS transistor including a single crystalline germanium layer as a channel layer according to some embodiments of the present invention.

Referring now to FIG. 3, a PMOS transistor includes a channel layer 30 including single crystalline germanium, a gate pattern 37 and source/drain regions 32. The channel layer 30 may be formed using a similar process as described with reference to FIG. 1. That is, a non-crystalline germanium layer may be formed on a seed layer (not shown), and a crystal structure of the non-crystalline germanium layer may be changed into a single crystalline structure by laser irradiation, thereby forming the single crystalline germanium layer as the channel layer.

The gate structure/pattern 37 is formed on the channel layer 30 and includes a gate insulation layer 34 and a gate conductive layer 36. Examples of the gate insulation layer 34 include oxide, metal oxide, and/or metal oxynitride. These can be used alone or in combination. A metal oxide layer may have a relatively small equivalent oxide thickness (EOT) and superior current leakage characteristics. As such, the gate insulation layer 34 may include a metal oxide layer formed on the channel layer 30 by an atomic layer deposition (ALD) process. Examples of the conductive layer 36 include polysilicon, metal, metal nitride, and/or metal silicide. These can also be used alone or in combination. The conductive layer 36 may be formed into a multilayer structure including a metal layer and a metal nitride layer, which may thereby improve electrical characteristics of the PMOS transistor.

The source/drain regions 32 are formed at surface portions of the channel layer 30 close to the gate pattern 37, and may be doped with impurities of elements in Group III of the periodic table. Examples of the elements in Group III include boron (B), gallium (Ga), and/or indium (In). These can be used alone or in combination. A first ion implantation process is performed onto a surface of the channel layer 30 using the gate pattern 37 as an implantation mask, thereby forming a shallow junction area at the surface portions of the channel layer 30.

A spacer 38 comprising a nitride is formed at a sidewall of the gate pattern 37. A second ion implantation process is also performed onto a surface of the channel layer 30 using the spacer 38 as an implantation mask, thereby forming a deeper junction area at the surface portions of the channel layer 30. Accordingly, the source/drain regions 32 include the shallow junction area and the deeper junction area at the surface portions of the channel layer 30.

According to some embodiments of the present invention, the PMOS transistor includes a channel layer 30 including single crystalline germanium, so that electrical characteristics of the PMOS transistor may be improved as compared with conventional PMOS transistors including a single crystalline silicon channel layer. In addition, the single crystalline germanium channel layer 30 is formed through a rapid phase transformation of a non-crystalline germanium layer on a seed layer due to local laser irradiation for a relatively short time period (ranging from about a few nano-seconds to about a few hundred nano-seconds). Accordingly, little to no thermal stress is applied to the seed layer in forming the single crystalline germanium channel layer, thereby improving reliability and performance of the PMOS transistor.

Hereinafter, a method of manufacturing the PMOS including a single crystalline germanium layer as a channel layer will be described with reference to FIGS. 4A to 4E. FIGS. 4A to 4E are cross sectional views illustrating intermediate fabrication steps in methods of manufacturing a PMOS transistor as shown in FIG. 3.

Figure 4A:
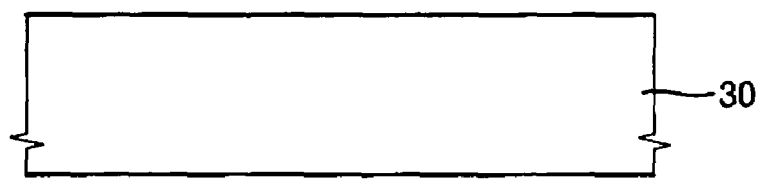
FIGS. 4A to 4E are cross sectional views illustrating intermediate fabrication steps in methods of fabricating PMOS transistors according to some embodiments of the present invention.

Referring now to FIG. 4A, a single crystalline germanium layer 30 is formed on a seed layer (not shown) in a similar process as described with reference to FIG. 1. That is, a non-crystalline germanium thin layer formed on the seed layer is selectively locally irradiated using a laser for a relatively short time period (ranging from about a few nano-seconds to about a few hundred nano-seconds) at an intensity sufficient to heat the non-crystalline germanium thin layer to about 937° C., and a crystal structure of the non-crystalline germanium thin layer is changed into a single-crystal structure, thereby forming the single crystalline germanium layer on the seed layer. The heat caused by the laser has relatively little effect on the seed layer, because the phase transformation of the non-crystalline germanium layer is locally generated for a relatively short period of time.

Figure 4B:
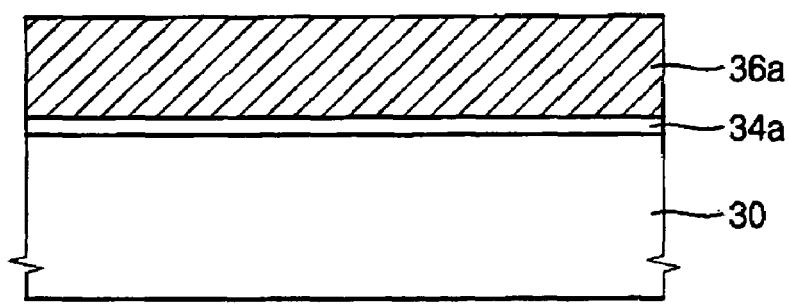

Referring now to FIG. 4B, an insulation layer 34a is formed on the channel layer 30. The insulation layer 34a may be a metal oxide layer formed by an ALD process. The ALD process for forming the metal oxide layer may include several sequential steps, such as: a providing step for providing source material→a first purging step to remove a residual source material→a providing step to provide an oxidizing agent→a second purging step to remove a residual oxidizing agent. Sequential performance of the above steps may complete a cycle of the ALD process, and the number of repeated cycles may determine a thickness of the insulation layer. The ALD process may be performed at least once to form the insulation layer of metal oxide on substrate 30. The source material includes a metal precursor. For example, the source material may include tetrakis ethyl methyl amino hafnium (TEMAH) (Hf[NC$_2$H$_5$CH$_3$]$_4$) or hafnium butyl oxide (Hf(O-tBu)$_4$) when a hafnium precursor is used in the ALD process, and may include trimethyl aluminum (TMA) (Al(CH$_3$)$_3$) when an aluminum precursor is used in the ALD process. Examples of the oxidizing agent include ozone (O$_3$), vapor (H$_2$O), non-activated oxygen (O$_2$), and/or oxygen (O$_2$) activated by plasma or remote plasma. These can be used alone or in combination. For example, when the insulation layer 34a includes a hafnium oxide layer, the ALD process may include the following sequential steps, such as: a providing step to provide TEMAH→a first purging step to remove a residual TEMAH→a providing step to provide ozone (O$_3$) gas as an oxidizing agent→a second purging step to remove residual ozone (O$_3$) gas.

A conductive layer 36a is formed on the insulation layer 34a. Examples of the conductive layer 36 may include polysilicon, metal, metal nitride, and/or metal silicide. The conductive layer 36 may be a multilayer structure including a metal layer and a metal nitride layer formed by a chemical vapor deposition (CVD) process, which may thereby improve electrical characteristics of the PMOS transistor. For example, the metal layer may include tungsten, and the metal nitride layer may include tungsten nitride.

Figure 4C:
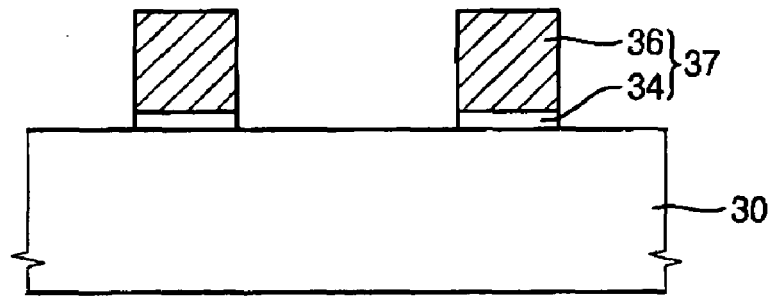

Referring now to FIG. 4C, the conductive layer 36a and the insulation layer 34a are patterned by a photolithography process, thereby forming a gate insulation layer 34 on the channel layer 30 and a gate conductive layer 36 on the gate insulation layer 34. The gate pattern 37 includes the gate insulation layer 34 and the gate conductive layer 36 stacked on the gate insulation layer 34. A hard mask pattern or a photoresist pattern may be used as an etching mask in the photolithography process.

Figure 4D:
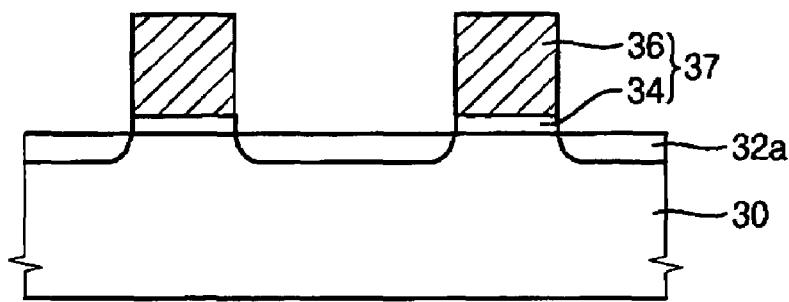

Referring now to FIG. 4D, a first ion implantation process is performed to implant impurities into a surface of the channel layer 30 using the gate pattern 37 as an implantation mask, so that a shallow junction area 32a is formed at surface portions of the channel layer 30 adjacent to the gate pattern 37. The impurities for the ion implantation process may include elements in Group III of the periodic table, as may be appropriate for a PMOS transistor.

Figure 4E:
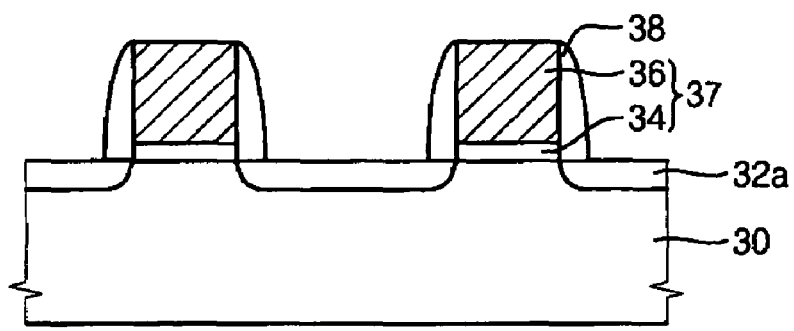

Referring now to FIG. 4E, a spacer 38 is formed on opposing sidewalls of the gate pattern 37. The spacer 38 functions as a mask in a subsequent self-aligned process for forming a contact plug, and as such, the spacer 38 may be a nitride layer having an etching selectivity with respect to an oxide. More particularly, a nitride layer (not shown) may be formed on the channel layer 30 to a thickness sufficient to cover the gate pattern 37 by a deposition process, and the nitride layer may be partially removed by an etching process until a top surface of the channel layer 30 is exposed, thereby forming the nitride spacer on the sidewall of the gate pattern 37.

A second ion implantation process is performed to implant impurities into the surface of the channel layer 30 using the spacer 38 as an implantation mask, so that a deeper junction area (not shown) is formed at surface portions of the channel layer 30 adjacent to the spacer 38. Impurities for the second ion implantation process may also include elements in Group III of the periodic table, like the shallow junction area 32a. Accordingly, the source/drain regions 32 are formed including a lightly doped source/drain structure (i.e., the shallow junction area 32a) and the deeper junction area at the surface portions of the channel layer 30.

Accordingly, a PMOS transistor as shown in FIG. 3 is formed by the process described above with reference to FIGS. 4A to 4E. More particularly, a channel layer of the PMOS transistor includes single crystalline germanium, thereby improving electrical characteristics of the PMOS transistor. In addition, little to no thermal stress is applied to the seed layer underlying the channel layer 30 in forming single the crystalline germanium layer on the seed layer, so that performance of the semiconductor device may hardly be affected by the heat employed to change the crystal structure of the non-crystalline germanium layer. Accordingly, a PMOS transistor may have improved reliability and/or superior performance.

Figure 5:
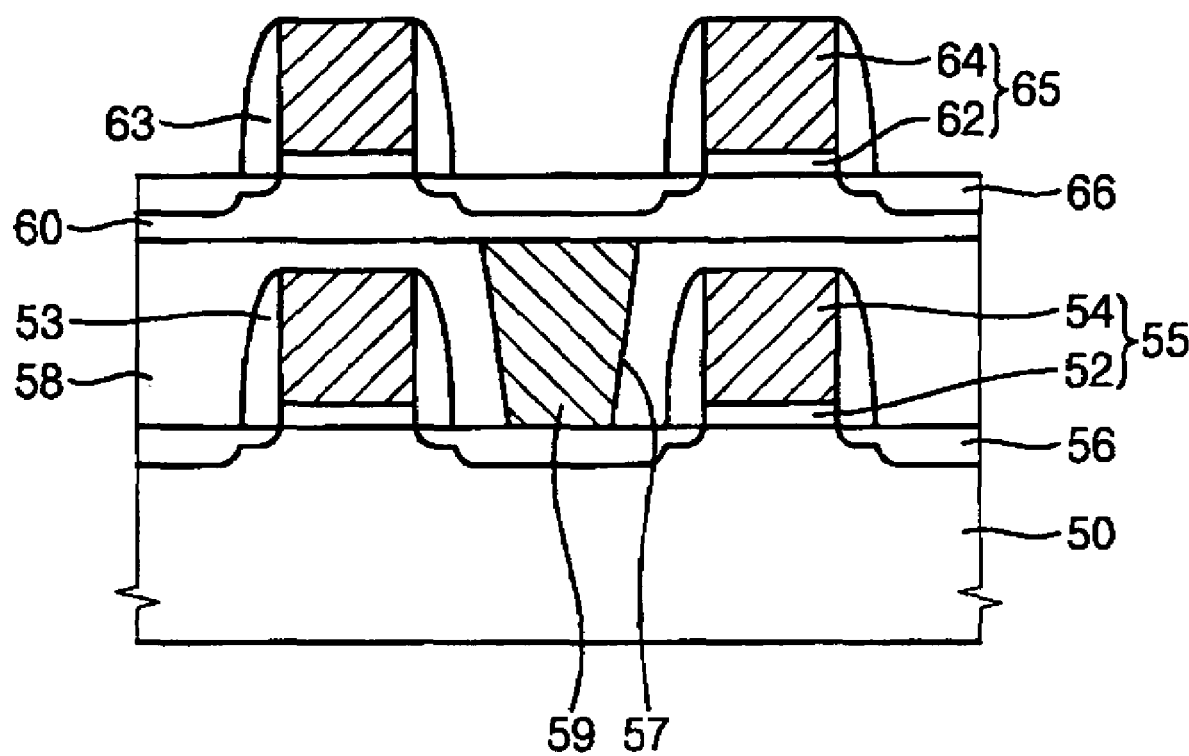
FIG. 5 is a cross sectional view illustrating a stacked semiconductor device including a PMOS transistor according to some embodiments of the present invention.

Hereinafter, a stacked semiconductor device including a PMOS transistor as discussed above is described with reference to FIG. 5. FIG. 5 is a cross sectional view illustrating a stacked semiconductor device including a PMOS transistor according to some embodiments of the present invention.

Referring now to FIG. 5, a stacked semiconductor device includes NMOS transistors at a lower portion thereof and PMOS transistors at an upper portion thereof, similar to a double-stacked SRAM device. The NMOS transistor includes a first channel layer 50 including single crystalline silicon and a first gate pattern 55 on the first channel layer 50. The first gate pattern 55 includes a first gate insulation layer 52 on the first channel layer 50 and a first conductive layer 54 on the first gate insulation layer 52. The NMOS transistor also includes first source/drain regions 56 formed at surface portions of the first channel layer 50 adjacent to the first gate pattern 55. The first source/drain regions 56 are doped with impurities including elements from Group V of the periodic table.

The first channel layer 50 may include a substrate formed of single crystalline silicon. However, when the first channel layer is not a base substrate in a semiconductor device, a single crystalline silicon layer may be used as the first channel layer 50, as would be known to one of the ordinary skill in the art. The single crystalline silicon layer may be formed by changing the crystal structure of a non-crystalline silicon layer on a seed layer using a laser. That is, a crystal structure of the non-crystalline silicon layer may be changed into a single crystalline structure due to heat caused by laser irradiation, thereby forming the single crystalline silicon layer on the seed layer. The non-crystalline silicon layer may be irradiated for a time ranging from about a few nano-seconds to about a few hundred nano-seconds at an intensity sufficient to heat the non-crystalline silicon layer to a temperature of about 1,410° C., because a melting point of the non-crystalline silicon is about 1,410° C. Although the the non-crystalline silicon layer is on the seed layer, little to no thermal stress is applied to the seed layer, because the laser is applied for a relatively short period of time of about a few hundred nano-seconds.

The PMOS transistor includes a second channel layer 60 formed of single crystalline germanium and a second gate pattern 65 on the second channel layer 60. The second gate pattern 65 includes a second gate insulation layer 62 on the second channel layer 60 and a second conductive layer 64 on the second gate insulation layer 62. The PMOS transistor also includes second source/drain regions 66 formed at surface portions of the second channel layer 60 adjacent to the second gate pattern 65. The second source/drain regions 66 are doped with impurities including elements in Group III of the periodic table.

The second channel layer 60 may be formed by changing the crystal structure of a non-crystalline germanium layer on an insulation interlayer 58 using a laser, by a process similar to that described with reference to FIG. 1. That is, a crystal structure of the non-crystalline germanium layer may be changed into a single crystalline structure due to heat caused by selectively locally irradiating the non-crystalline germanium layer using a laser, thereby forming the single crystalline germanium layer as the second channel layer 60 on the insulation interlayer 58. Accordingly, although the non-crystalline germanium layer is irradiated on the insulation interlayer 58, little to no thermal stress is applied to the insulation interlayer 58, because the laser is locally applied for a relatively short period of time of about a few hundred nanoseconds. As such, the heat from the laser may not damage the NMOS transistor under the insulation interlayer 58.

The insulation interlayer 58 is interposed between the first channel layer 50 and the second channel layer 60, and includes an opening 57 extending therethrough. A single crystalline plug 59 is formed in the opening 57. The plug 59 may have a similar structure as that of the seed layer 10 described with reference to FIG. 1.

Hereinafter, a method of fabricating the stacked semiconductor device including NMOS transistors and PMOS transistors vertically stacked on a substrate will now be described with reference to FIGS. 6A to 6F. FIGS. 6A to 6F are cross sectional views illustrating intermediate fabrication steps for a method of manufacturing the stacked semiconductor device as shown in FIG. 5.

Figure 6A:
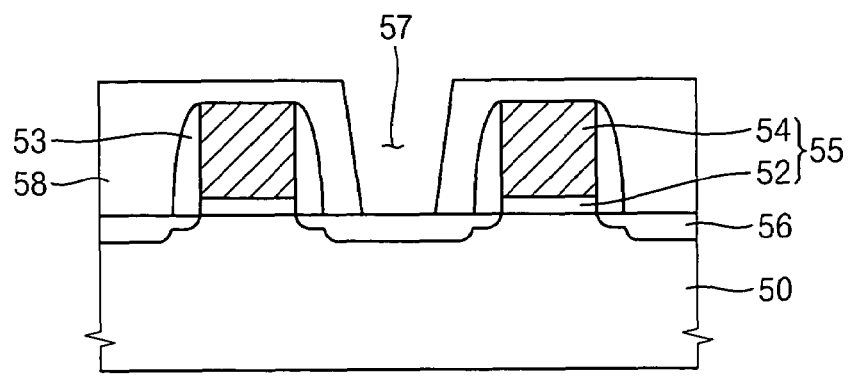
FIGS. 6A to 6F are cross sectional views illustrating intermediate fabrication steps in methods of fabricating stacked semiconductor devices according to some embodiments of the present invention.

Referring now to FIG. 6A, a first channel layer 50 including single crystalline silicon is prepared for fabrication of a stacked semiconductor device. More particularly, the first channel layer 50 may include a substrate formed of single crystalline silicon. However, when the first channel layer is not a base substrate in a semiconductor device, a single crystalline silicon layer may be used as the first channel layer 50, as would be known to one of the ordinary skill in the art. The single crystalline silicon layer may be formed by a similar process as that described with reference to FIG. 5.

When the first channel layer 50 is a base substrate including single crystalline silicon, a device isolation layer may be formed on the substrate to thereby define an active region and a field region on the substrate. In the present embodiment, a trench isolation layer is utilized as the device isolation layer rather than a field oxide layer, in view of a desired degree of integration for the semiconductor device. Etching, deposition, and planarization processes are sequentially performed so as to form the device isolation layer on the substrate.

A first insulation layer (not shown) for a first gate insulation layer 52 is formed on the first channel layer 50. Examples of the first insulation layer may include an oxide, a metal oxide, and/or a metal oxynitride. These can be used alone or in combination. Examples of the metal oxide may include $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, $MgO$, $SrO$, $B_2O_3$, $SnO_2$, $PbO$, $PbO_2$, $Pb_3O_4$, $V_2O_3$, $La_2O_3$, $Pr_2O_3$, $Sb_2O_3$, $Sb_2O_5$, and/or $CaO$. These can also be used alone or in combination. The first insulation layer may include a metal oxide layer formed by an ALD process. The ALD process for forming the metal oxide layer may be similar to that described with reference to FIG. 4B, and as such, further description of the process for forming the metal oxide layer will be omitted.

A first conductive layer (not shown) for a first gate conductive layer 54 is formed on the first insulation layer. Examples of a material that can be used for the first conductive layer may include polysilicon, metal, metal nitride, and/or metal silicide. These can be used alone or in combination. The conductive layer 54 may be formed into a multilayer structure including a metal layer and a metal nitride layer formed by a chemical vapor deposition (CVD) process, which may thereby improve electrical characteristics of the PMOS transistor.

The conductive layer and the insulation layer are patterned by a photolithography process, thereby forming the gate conductive layer 54 and the gate insulation layer 52. Accordingly, the gate pattern 55 including the gate conductive layer 54 and the gate insulation layer 52 is formed on the first channel layer 50. In the photolithography process, a hard mask pattern including a nitride or a photoresist pattern may be used as a mask. In particular, when the hard mask pattern including nitride is used in the photolithography process, the hard mask may be formed as a portion of the first gate pattern 55.

A first ion implantation process is performed to implant impurities into a surface of the first channel layer 50 using the first gate pattern 55 as an implantation mask, so that a first shallow junction area (not shown) is formed at surface portions of the first channel layer 50 adjacent to the first gate pattern 55. Impurities for the first ion implantation process may include elements in Group V of the periodic table, as may be suitable for an NMOS transistor. The elements in Group V may include antimony (Sb), phosphorus (P) and/or arsenic. These can be used alone or in combination.

A first spacer 53 is formed on opposing sidewalls of the first gate pattern 55 in a similar process as described with reference to FIG. 4E. That is, a deposition process and an etching process may sequentially be performed so as to form the first spacer 53 on the sidewalls of the first gate pattern 55.

A second ion implantation process is performed to implant impurities into the surface of the first channel layer 50 using the first spacer 53 as an implantation mask, so that a deeper junction area (not shown) is formed at surface portions of the first channel layer 50 adjacent to the first spacer 53. Impurities for the second ion implantation process may also include elements from Group V of the periodic table like the shallow junction area. However, an impurity concentration of the deeper junction area may be greater than that of the shallow junction area.

Accordingly, first source/drain regions 52 include a lightly doped source/drain structure (including the shallow junction area) and the deeper junction area at the surface portions of the first channel layer 50. As a result, an NMOS transistor is formed on the first channel layer 50 and includes the first gate pattern 55 and the first source/drain regions 56.

Although the present embodiment discloses NMOS transistors formed on the first channel layer, metal wiring, logic devices, and/or any other various configurations for a semiconductor device known to one of the ordinary skill in the art may also be formed on the first channel layer in conjunction with the NMOS transistors.

Still referring to FIG. 6A, an insulation interlayer 58 is formed on the first channel layer 50 including the NMOS transistor and includes an opening 57 through which a surface of the first channel layer 50 is exposed. The insulation interlayer 58 includes an oxide layer formed by a chemical vapor deposition (CVD) process. A photo resist pattern (not shown) is formed on the insulation interlayer 58, and the insulation interlayer 58 is partially etched using the photoresist pattern as an etching mask, thereby forming the opening 57 through which the surface of the first channel layer 50 is exposed between the first gate patterns 55.

Figure 6B:
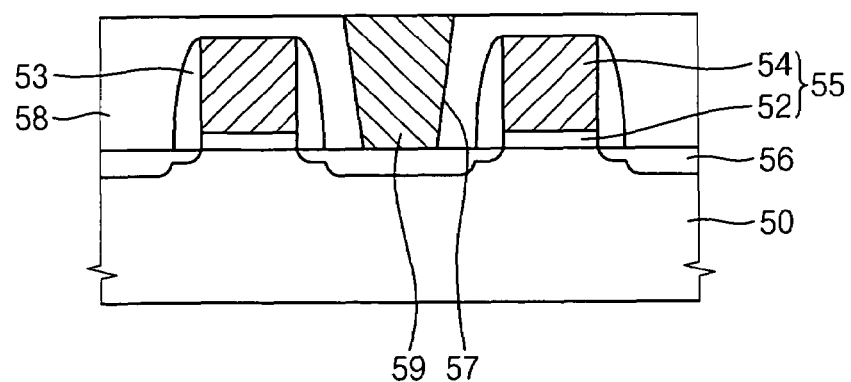

Referring now to FIG. 6B, a selective epitaxial process is performed in the opening 57, so that a single crystalline silicon layer is grown from the surface of the first channel layer 50 exposed through the opening 57 to a top portion of the opening 57. Accordingly, the opening 57 is filled with the single crystalline silicon layer, thereby forming a plug 59 (having a similar structure as the first channel layer 50) in the opening 57.

When the selective epitaxial process is performed such that the single crystalline silicon layer extends onto the insulation interlayer 58 outside the opening 57, a planarization process such as a chemical mechanical polishing (CMP) process may be further performed on the single crystalline silicon layer. That is, the single crystalline silicon layer may be removed by the planarization process until a top surface of the insulation interlayer 58 is exposed, so that the single crystalline silicon layer remains only in the opening 57 to thereby form the plug 59 filling the opening 57.

Figure 6C:
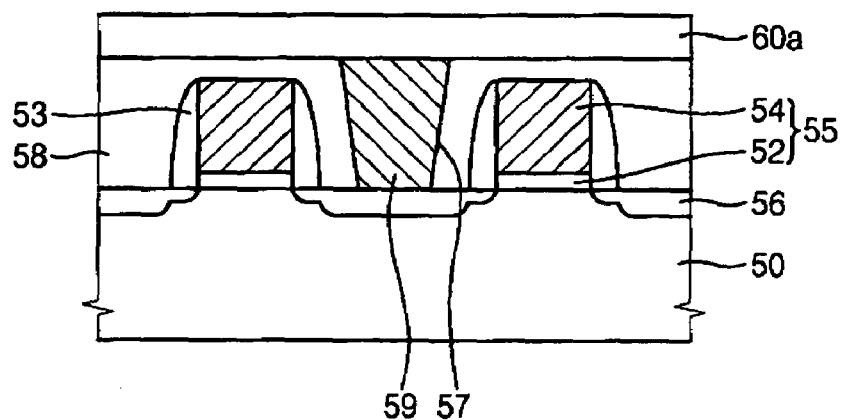

Referring now to FIG. 6C, a non-crystalline germanium layer 60a is formed on the insulation interlayer 58 including the plug 59, for example, by a CVD process. The non-crystalline germanium layer 60a includes an amorphous germanium layer and multi-crystalline germanium layer. Although the non-crystalline germanium layer 60a may be formed to any desired thickness, the non-crystalline germanium layer 60a is generally formed to have a relatively small thickness in view of a degree of integration of a semiconductor device.

Figure 6D:
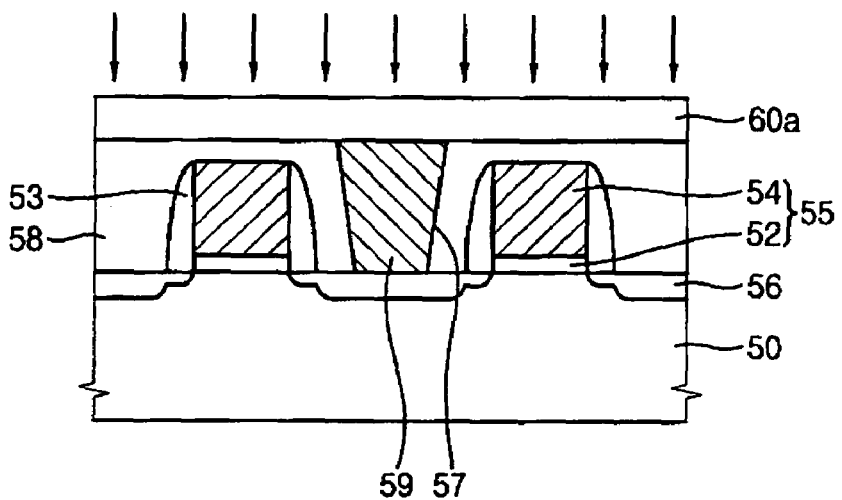
Figure 7:
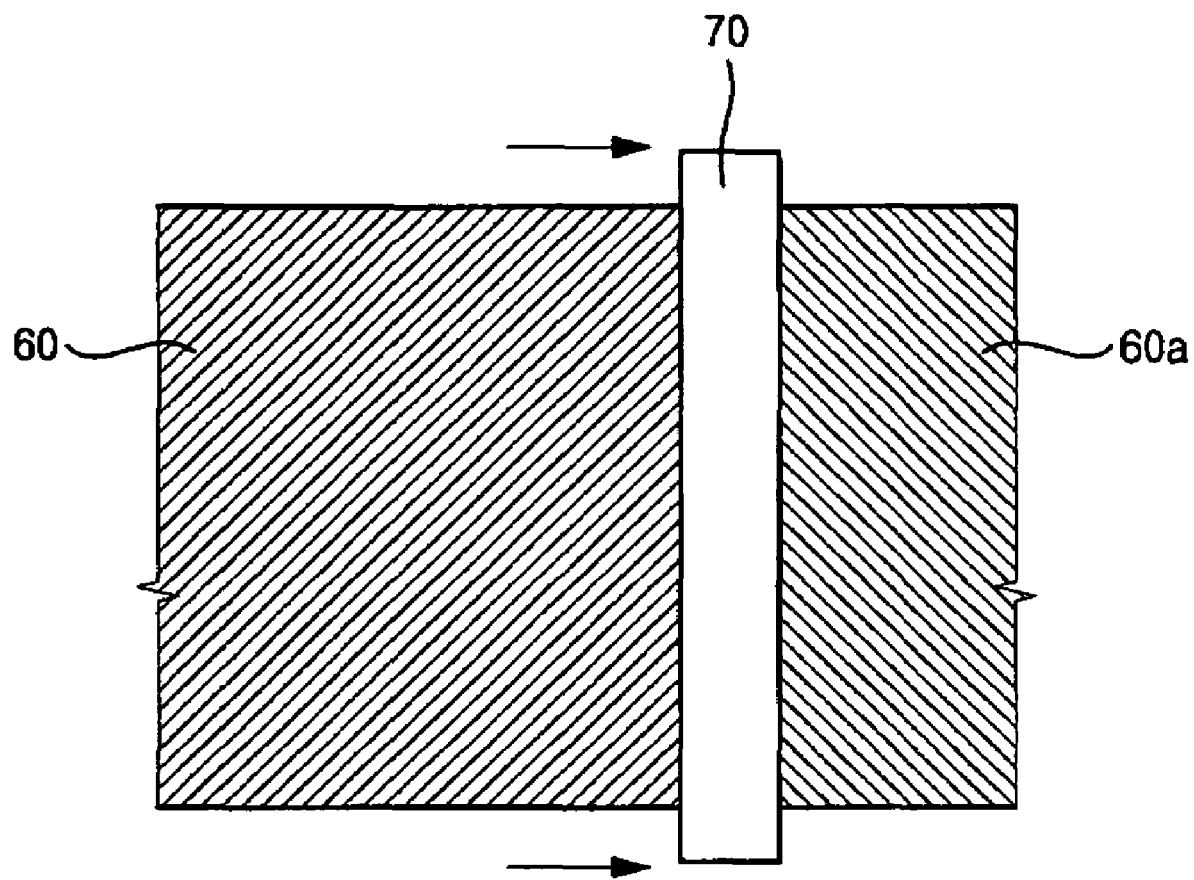
FIG. 7 is a plan view illustrating movement of a laser unit for irradiating a non-crystalline germanium layer according to some embodiments of the present invention.

Referring now to FIG. 6D, a laser is used to selectively locally irradiate the non-crystalline germanium layer 60a. More particularly, a laser unit, such as the laser unit 70 in FIG. 7, repeatedly scans the surface of the non-crystalline germanium layer 60a to irradiate the non-crystalline germanium layer 60a, as described with reference to FIG. 1. That is, the non-crystalline germanium layer 60a is locally irradiated for a relatively short period of time (ranging from about a few nano-seconds to about a few hundred nano-seconds) at an intensity sufficient to heat the non-crystalline germanium layer 60a to a temperature of about 937° C. As such, a lower portion of the first channel layer is heated to a temperature of about 400° C. in irradiating the non-crystalline germanium layer 60a.

Figure 6E:
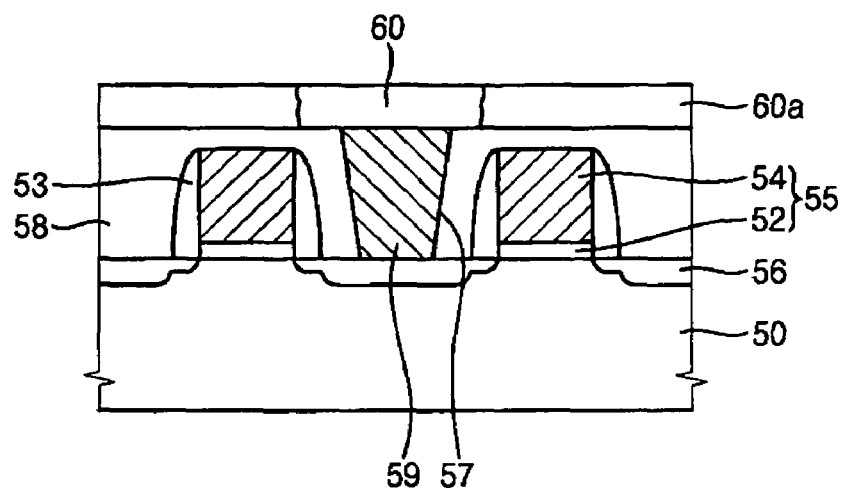
Figure 6F:
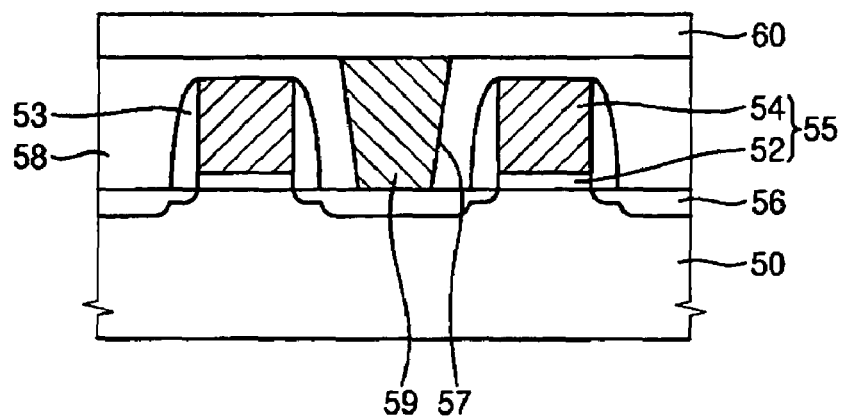

Referring now to FIGS. 6E and 6F, a phase of the non-crystalline germanium layer 60a is transformed by the heat from the laser. That is, the non-crystalline germanium layer 60a is melted by the laser, so the non-crystalline germanium layer 60a is changed from a solid state to a liquid state. The phase transformation of the non-crystalline germanium layer 60a may occur from a top/upper surface thereof (opposite the insulation layer 58) to a bottom/lower surface making contact with the insulation interlayer 58. The single crystal of the plug 59 functions as a seed in transforming the phase of the non-crystalline germanium layer 60a, and as such, a crystal structure of the non-crystalline germanium layer 60a is changed into a single crystal structure.

Figure 8:
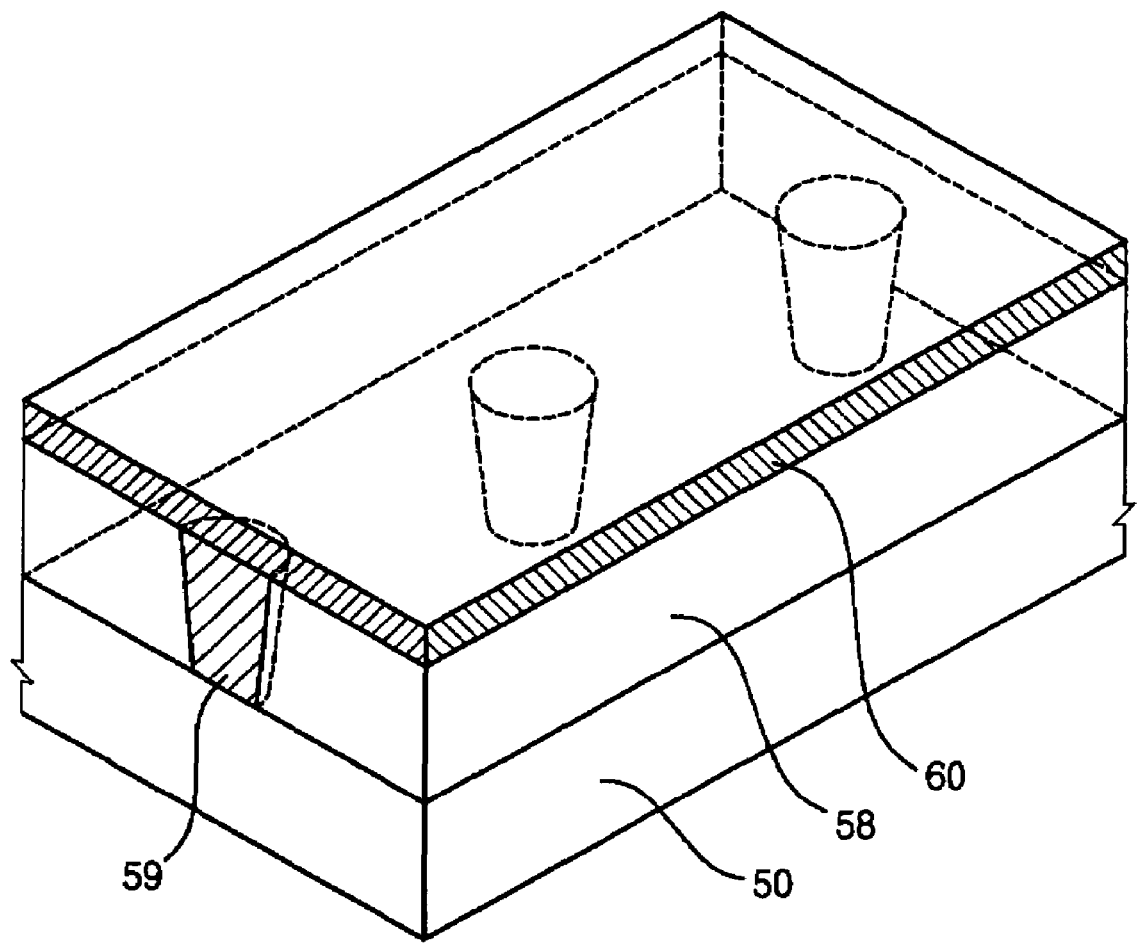
FIG. 8 is a perspective view illustrating a stacked semiconductor device according to some embodiments of the present invention.

Accordingly, the non-crystalline germanium layer 60a is transformed into a second channel layer 60 of single crystalline germanium by the laser, as shown in FIG. 8. In FIG. 8, the first semiconductor structure on the first channel layer (including the NMOS transistors) 50 is omitted for simplification.

As described above, the second channel layer 60 is formed by selectively locally irradiating the non-crystalline germanium layer 60a using a laser for a relatively short period of time of about a few nano-seconds to about a few hundred nano-seconds. Accordingly, although the non-crystalline germanium layer 60a is heated to a relatively high temperature, very little thermal stress may be applied to the NMOS transistors underlying the second channel layer 60. As a result, the second channel layer 60 may be formed without causing thermal defects on the first semiconductor structure on the first channel layer 50.

Then, a PMOS transistor is formed on the second channel layer 60 as a second semiconductor structure in a similar process as described with reference to FIGS. 4B to 4E, so that the PMOS transistor includes a second gate pattern 65 and second source/drain regions 66. The second gate pattern 65 includes a second gate insulation layer 62 on the second channel layer 60 and a second conductive gate layer 64 on the second gate insulation layer 62, and the second source/drain regions 66 have an LDD structure. Further, a second spacer 63 is formed on opposing sidewalls of the second gate pattern 65 in a similar process as described above with reference to the first spacer 53.

Although the present embodiment discloses PMOS transistors formed on the second channel layer, metal wiring, logic devices, and/or any other various configurations for a semiconductor device known to one of ordinary skill in the art may also be formed on the second channel layer in conjunction with the PMOS transistors.

Thus, a stacked semiconductor device includes an NMOS transistor and a PMOS transistor vertically stacked on a seed layer. However, a pair of the NMOS and PMOS transistors may be sequentially stacked on the seed layer by repeating the processes as described above, so that the stacked semiconductor device may also include a plurality of NMOS and PMOS transistors, as would be known to one of ordinary skill in the art.

While some embodiments of the present invention disclose that an NMOS transistor is formed on the first channel layer at a lower portion of the stacked semiconductor device and a PMOS transistor is formed on the second channel layer at an upper portion of the stacked semiconductor device, it is to be understood that a PMOS device may be formed at the lower portion of the stacked semiconductor device, and an NMOS device may be formed at the upper portion of the stacked semiconductor device.

According to some embodiments of the present invention, a single crystalline germanium channel layer is formed with very little thermal stress to an underlying structure, thereby improving electrical characteristics of a PMOS transistor. In particular, the single crystalline germanium channel layer may be applied in a stacked semiconductor device. As a result, a semiconductor device including the single crystalline germanium channel layer may have improved integration and/or electrical performance.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

That which is claimed:

1. A method of fabricating a transistor device, the method comprising:
   forming a non-crystalline germanium layer on a seed layer; and
   selectively locally heating the non-crystalline germanium layer to a temperature of about 937 degrees Celsius (° C.) to about 1000 degrees Celsius (° C.) using laser irradiation to form a single-crystalline germanium layer on the seed layer.

2. A method of fabricating a transistor device, the method comprising:
   forming a non-crystalline germanium layer on a seed layer; and
   selectively locally heating the non-crystalline germanium layer to about a melting point thereof by applying a laser to a portion of the non-crystalline germanium layer for less than about 100 nanoseconds (ns) to form a single-crystalline germanium layer on the seed layer.

3. The method of claim 2, wherein applying the laser further comprises:
   scanning the laser across the non-crystalline germanium layer from a first end to a second end thereof.

4. The method of claim 2, wherein selectively locally heating the non-crystalline germanium layer comprises:
   heating the non-crystalline germanium layer to a temperature of about 937 degrees Celsius (° C.) to about 1000 degrees Celsius (° C.) using the laser.

5. The method of claim 4, wherein selectively locally heating the non-crystalline germanium layer further comprises:
   heating the seed layer to a temperature of about 200 degrees Celsius (° C.) to about 600 degrees Celsius (° C.).

6. The method of claim 2, wherein the seed layer has an absorption coefficient different from that of the non-crystalline germanium layer.

7. The method of claim 2, wherein the seed layer comprises silicon and/or germanium.

8. The method of claim 2, further comprising:
   forming a gate structure on the single crystalline germanium layer; and
   forming first and second p-type source/drain regions in the single crystalline germanium layer on opposite sides of the gate structure to define a p-type transistor device.

9. The method of claim 8, wherein forming first and second p-type source/drain regions comprises:
   doping the single-crystalline germanium layer with Group III impurity atoms using the gate structure as a mask.

10. A method of fabricating a transistor device, the method comprising:
    forming a first gate structure on a substrate;
    forming first and second n-type source/drain regions in the substrate on opposite sides of the first gate structure to define an n-type transistor device;
    forming a seed layer on the substrate adjacent the first gate structure;
    forming a non-crystalline germanium layer on the seed layer;
    selectively locally heating the non-crystalline germanium layer to about a melting point thereof to form a single-crystalline germanium layer on the seed layer;
    forming a second gate structure on the single crystalline germanium layer; and
    forming first and second p-type source/drain regions in the single crystalline germanium layer on opposite sides of the second gate structure to define a p-type transistor device.

11. A method of fabricating a semiconductor device, comprising:
    forming an n-type transistor on a silicon substrate;
    forming a non-crystalline germanium layer on the substrate;
    selectively locally irradiating the non-crystalline germanium layer using a laser to heat the non-crystalline germanium layer to a temperature of about 937 degrees Celsius (° C.) to about 1000 degrees Celsius (° C.) to form a single-crystalline germanium layer; and
    forming a p-type transistor on the single-crystalline germanium layer.

12. A method of fabricating a semiconductor device, comprising:
    forming an n-type transistor on a silicon substrate;
    forming a non-crystalline germanium layer on the substrate;
    selectively locally irradiating the non-crystalline germanium layer using a laser to heat the non-crystalline germanium layer to about a melting point thereof by applying the laser to a portion of the non-crystalline germanium layer for less than about 100 nanoseconds (ns) to form a single-crystalline germanium layer; and
    forming a p-type transistor on the single-crystalline germanium layer.

13. The method of claim 12, wherein applying the laser further comprises:
    scanning the laser across the non-crystalline germanium layer from a first end to a second end thereof.

14. The method of claim 12, wherein selectively locally irradiating the non-crystalline germanium layer comprises:
    heating the non-crystalline germanium layer to a temperature of about 937 degrees Celsius (° C.) to about 1000 degrees Celsius (° C.) using the laser.

15. The method of claim 12, further comprising the following prior to forming the non-crystalline germanium layer:
    forming an insulation layer on the n-type transistor and the substrate having an opening extending therethrough and exposing a surface of the substrate; and
    forming a contact plug in the opening,
    wherein forming the non-crystalline germanium layer comprises forming the non-crystalline germanium layer on the insulation layer and on the contact plug.

16. The method of claim 15, wherein forming the contact plug in the opening comprises:
    epitaxially growing a silicon seed layer in the opening on the exposed surface of the substrate.

17. The method of claim 12, wherein forming the p-type transistor comprises:
    forming a gate structure on the single-crystalline germanium layer; and
    doping the single-crystalline germanium layer with Group III impurity atoms using the gate structure as a mask to define first and second p-type source/drain regions in the single crystalline germanium layer on opposite sides of the gate structure.

18. A method of fabricating a semiconductor device, comprising:
    forming a first gate structure on the silicon substrate;
    doping the substrate with Group V impurity atoms using the first gate structure as a mask to define an n-type transistor including first and second n-type source/drain regions in the substrate on opposite sides of the first gate structure;

forming a non-crystalline germanium layer on the substrate;
selectively locally irradiating the non-crystalline germanium layer using a laser to heat the non-crystalline germanium layer to about a melting point thereof to form a single-crystalline germanium layer;
forming a second gate structure on the single-crystalline germanium layer; and
doping the single-crystalline germanium layer with Group III impurity atoms using the second gate structure as a mask to define a p-type transistor including first and second p-type source/drain regions in the single crystalline germanium layer on opposite sides of the second gate structure.

* * * * *